(12) United States Patent
Chung et al.

(10) Patent No.: US 11,538,660 B2
(45) Date of Patent: Dec. 27, 2022

(54) PLASMA PROCESSING APPARATUS AND METHOD OF FABRICATING SEMICONDUCTOR DEVICE USING SAME

(71) Applicant: SAMSUNG ELECTRONICS CO., LTD., Suwon-si (KR)

(72) Inventors: Yoong Chung, Hwaseong-si (KR); Nam Kyun Kim, Seoul (KR); Naohiko Okunishi, Hwaseong-si (KR); Kyung-Sun Kim, Suwon-si (KR); Seung Bo Shim, Seoul (KR); Sang-Ho Lee, Hwaseong-si (KR); Kang Min Jeon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 57 days.

(21) Appl. No.: 17/242,019

(22) Filed: Apr. 27, 2021

(65) Prior Publication Data

US 2022/0139669 A1     May 5, 2022

(30) Foreign Application Priority Data

Nov. 3, 2020   (KR) .......................... 10-2020-0145056

(51) Int. Cl.
  *H01J 37/32* (2006.01)
  *H01L 21/311* (2006.01)
(52) U.S. Cl.
  CPC .. *H01J 37/32082* (2013.01); *H01J 37/32568* (2013.01); *H01J 37/32633* (2013.01);
  (Continued)

(58) Field of Classification Search
  CPC ........... H01J 37/32083; H01J 37/32568; H01J 37/32642
  See application file for complete search history.

(56) References Cited

U.S. PATENT DOCUMENTS 9,076,636 B2   7/2015  Ohata et al.
10,340,174 B2  7/2019  Yamaguchi et al.
(Continued)

FOREIGN PATENT DOCUMENTS

JP    4640922 B2    3/2011
KR    2079595 B1    4/2020

*Primary Examiner* — Binh X Tran
(74) *Attorney, Agent, or Firm* — Volentine, Whitt & Francos, PLLC

(57) ABSTRACT

A plasma processing apparatus includes; a chamber, a lower electrode disposed within the chamber and including a lower surface and an opposing upper surface configured to seat a wafer, an RF rod disposed on the lower surface of the lower electrode and extending in a vertical direction. The RF plate includes a first portion contacting the lower surface of the lower electrode, a second portion protruding from the first portion towards the RF rod, and a third portion extending from the second portion to connect the RF rod. A grounding electrode is spaced apart from the RF plate and at least partially surrounds a side wall of the RF rod and a side wall of the second portion of the RF plate. The grounding electrode includes a first grounding electrode facing each of the side wall of the RF rod and the second portion of the RF plate, and a second grounding electrode at least partially surrounding the first grounding electrode, and configured to horizontally rotate.

16 Claims, 19 Drawing Sheets

(52) U.S. Cl.
CPC .. *H01J 37/32642* (2013.01); *H01L 21/31116* (2013.01); *H01J 2237/334* (2013.01)

(56) References Cited

U.S. PATENT DOCUMENTS

| | | | |
|---|---|---|---|
| 2008/0236753 A1* | 10/2008 | Yamazawa | H01L 21/67069 156/345.43 |
| 2012/0164834 A1 | 6/2012 | Jennings et al. | |
| 2018/0308663 A1* | 10/2018 | Collins | H01J 37/32137 |
| 2019/0006156 A1 | 1/2019 | Seo et al. | |
| 2019/0172684 A1 | 6/2019 | Keil et al. | |
| 2019/0348263 A1* | 11/2019 | Okunishi | H03H 7/0115 |
| 2019/0385826 A1* | 12/2019 | Weng | H01J 37/32091 |
| 2020/0027705 A1 | 1/2020 | Kim et al. | |
| 2021/0005419 A1* | 1/2021 | Son | H01L 21/68742 |
| 2022/0037127 A1* | 2/2022 | Nakatani | H01J 37/32642 |

\* cited by examiner

FIG. 3
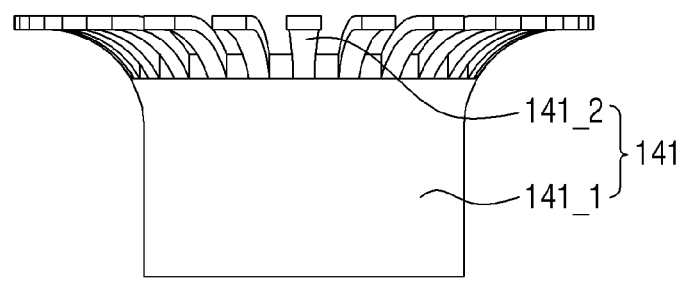
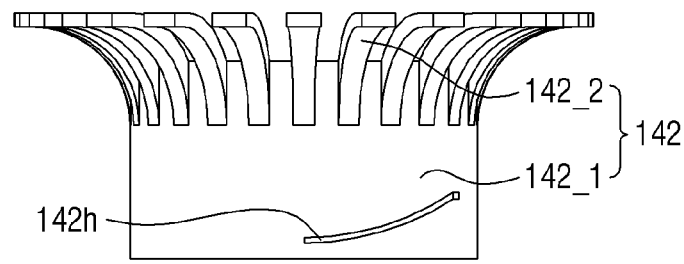
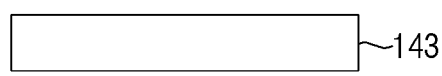

FIG. 8
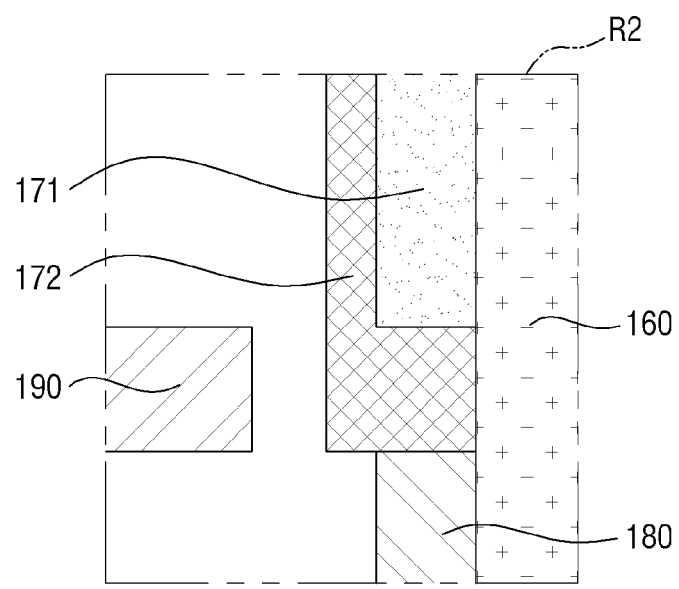
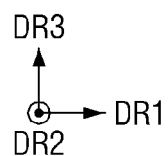

PLASMA PROCESSING APPARATUS AND METHOD OF FABRICATING SEMICONDUCTOR DEVICE USING SAME

This application claims priority under 35 U.S.C. 119 from Korean Patent Application No. 10-2020-0145056 filed on Nov. 3, 2020 in the Korean Intellectual Property Office, the subject matter of which is hereby incorporated by reference.

BACKGROUND

1. Technical Field

The inventive concept relates generally to plasma processing apparatuses and methods of fabricating a semiconductor device using same.

2. Description of the Related Art

High aspect ratio etching is required with the increased number of stacked stages that characterize next-generation vertical NAND flash memory devices (VNAND). In particular, the management of the so-called Skew-Critical Dimension (SCD) is important, since the separation of defined centers between upper and lower ones of the stacked stages tend to increase.

A radio frequency (RF) power source used to generate plasma during certain semiconductor fabrication processes may undesirably generate harmonics in addition to the fundamental waves of very high frequencies. Such harmonics are a principal cause of inconsistencies in the SCD in which plasma density and etch rate of a central portion becomes relatively high. Accordingly, various solutions have been investigated to improve the SCD.

SUMMARY

In one aspect, embodiments of the inventive concept provide plasma processing apparatuses capable of effectively controlling an etching amount for a plasma process applied to a central portion of a wafer by adjusting an area of a grounding electrode facing an RF plate. Other embodiments of the inventive concept provide methods of fabricating a semiconductor device using such plasma processing apparatuses.

In another aspect, embodiments of the inventive concept provide plasma processing apparatuses capable of effectively controlling an etching amount for a plasma etching process applied to an edge portion of a wafer by disposing a conductor ring insulated from each of a lower electrode and an RF plate to surround the side walls of each of the lower electrode and the RF plate. Other embodiments of the inventive concept provide methods of fabricating a semiconductor device such plasma processing apparatuses.

In still another aspect, embodiments of the inventive concept provide plasma processing apparatuses capable of controlling an etching amount for a plasma etching process applied to an edge portion of a wafer by disposing a baffle unit spaced apart from a conductor ring. Other embodiments of the inventive concept provides methods of fabricating a semiconductor device using such plasma processing apparatuses.

In each of the foregoing aspects, as well as other aspects that will become apparent to those skilled in the art upon consideration of the following detailed description together with the accompanying drawings, embodiments of the inventive concept provide improved reliability of plasma etching processes by at least one of; adjusting an area of a grounding electrode facing the RF plate, adjusting an arrangement of a conductor ring, and configuring a baffle unit spaced apart from the conductor ring to adjust the overall etch rate of the wafer.

According to embodiments of the inventive concept, there is provided a method of fabricating a semiconductor device. The method includes; seating a wafer in relation to an RF plate within a plasma processing apparatus, and adjusting an area of a grounding electrode facing the RF plate to adjust an etching amount for a plasma process applied to the wafer. Here, the plasma processing apparatus includes; a lower electrode and an RF rod disposed below the lower electrode, the RF plate includes a first portion contacting the lower electrode and a second portion extending from the first portion towards the RF rod, and the grounding electrode at least partially surrounding a side wall of the second portion of the RF plate and is spaced apart from the RF plate, and the grounding electrode includes; a first grounding electrode facing the second portion of the RF plate, and a second grounding electrode at least partially surrounding the first grounding electrode, wherein the first grounding electrode includes spaced apart, first wing portions respectively having a curved shape and extending outwardly from the side wall of the second portion of the RF plate towards an edge of the first portion of the RF plate, and the second grounding electrode includes spaced apart, second wing portions respectively having a curved shape and extending along one of the first wing portions towards the edge of the first portion of the RF plate.

According to embodiments of the inventive concept, there is provided a plasma processing apparatus including; a chamber, a lower electrode disposed within the chamber and including a lower surface and an opposing upper surface configured to seat a wafer, an RF rod disposed on the lower surface of the lower electrode and extending in a vertical direction, an RF plate including a first portion contacting the lower surface of the lower electrode, a second portion protruding from the first portion towards the RF rod, and a third portion extending from the second portion to connect the RF rod, and a grounding electrode spaced apart from the RF plate and at least partially surrounding a side wall of the RF rod and a side wall of the second portion of the RF plate, wherein the grounding electrode includes a first grounding electrode facing each of the side wall of the RF rod and the second portion of the RF plate, and a second grounding electrode at least partially surrounding the first grounding electrode, and configured to horizontally rotate.

According to embodiments of the inventive concept, there is provided a plasma processing apparatus including; a chamber, a lower electrode disposed within the chamber and including a lower surface and an opposing upper surface configured to seat a wafer, an RF rod disposed on the lower surface of the lower electrode and downwardly extending, an RF plate including a first portion contacting with the lower surface of the lower electrode, a second portion extending downward from the first portion towards the RF rod, and a third portion extending downward from the second portion to connect the RF rod, a first grounding electrode spaced apart from the RF plate and at least partially surrounding a side wall of the RF rod and a side wall of the second portion of the RF plate, an insulator ring at least partially surrounding a side wall of the lower electrode and a side wall of the first portion of the RF plate and a conductor ring at least partially surrounding a side wall of the insulator ring, wherein the first grounding electrode includes a first side wall portion vertically extending along the side wall of the RF rod, and first wing portions spaced apart from one another, respectively having a curved shape and extending along the side wall of the second portion of the RF plate and towards an edge of the first portion of the RF plate.

BRIEF DESCRIPTION OF THE DRAWING

The foregoing and other aspects, as well as the making and use of the inventive concept may be understood upon consideration of the following detail description together with the accompanying drawings, in which:

FIG. 3 is a side view further illustrating a grounding electrode of the plasma processing apparatus according to embodiments of the inventive concept;

FIG. 8 is an enlarged view of region 'R2' indicated in FIG. 1;

DETAILED DESCRIPTION

Figure 1:
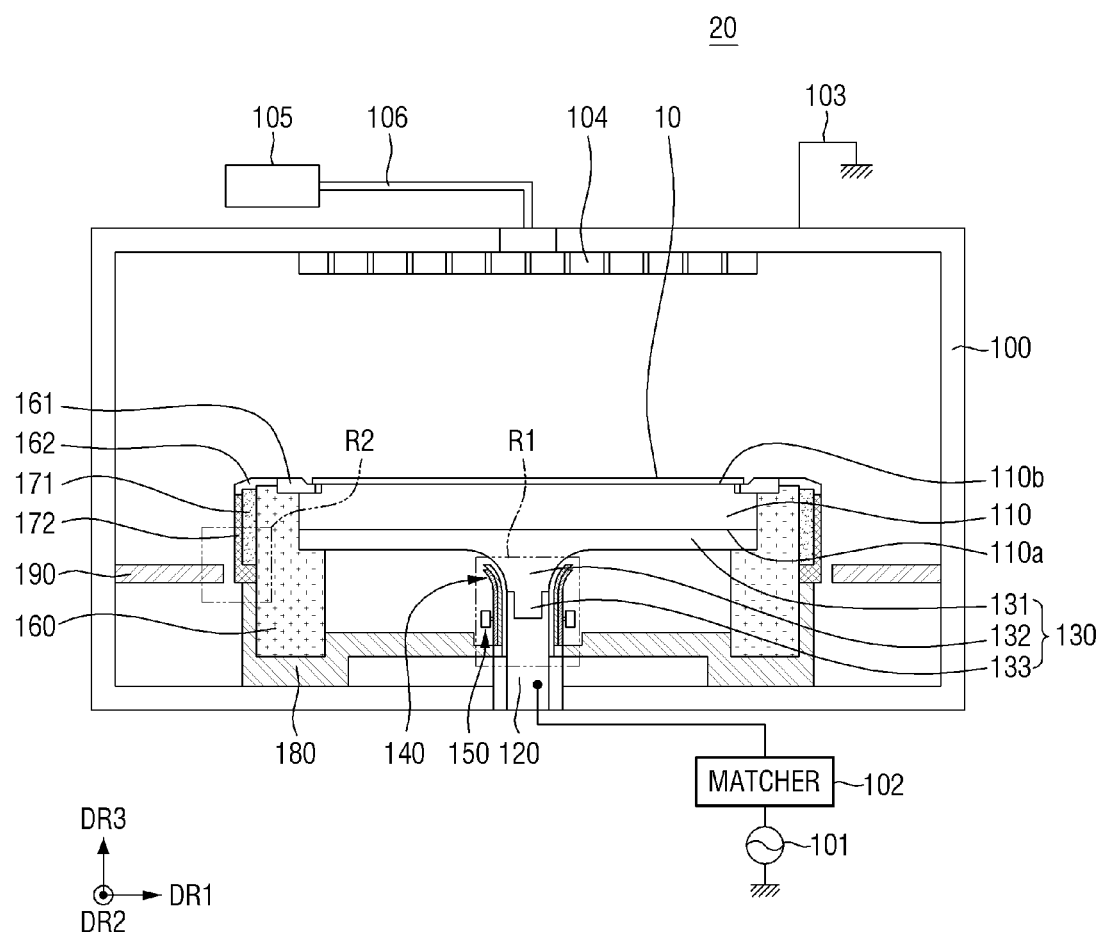
FIG. 1 is a side view illustrating a plasma processing apparatus according to embodiments of the inventive concept.

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Hereinafter, a plasma processing apparatus 20 according to embodiments of the inventive concept will be described in relation to Figures (FIGS. 1, 2, 3, 4, 5, 6, 7, 8 and 9 (hereafter collectively, "FIGS. 1 to 9").

Referring to FIGS. 1 to 9, the plasma processing apparatus 20 may include a chamber 100, a power supply 101, a matcher 102, a grounding line 103, a gas feeder 104, a gas source 105, a gas supply line 106, a lower electrode 110, a radio frequency (RF) rod 120, an RF plate 130, a grounding electrode 140, a guide portion 150, an insulating plate 160, a focus ring 161, an edge ring 162, an insulator ring 171, a conductor ring 172, a grounding plate 180 and a baffle unit 190.

The chamber 100 serves as a housing for many components variously disposed therein, and provides an environmentally-controlled space in which various processes (including plasma processes) may be performed during the fabrication of a semiconductor device. That is, a prescribed sequence of semiconductor processes may be applied to a wafer 10 that has been "seated" (e.g., provided and/or appropriately positioned) within the chamber 100 in order to fabricate semiconductor device(s) on the wafer 10. In this regard, the environmentally-controller interior of the chamber 100 may selectively provide different process conditions (e.g., temperature, pressure, atmospheric gas content, electro-magnetic field, electrical voltage potential, etc.) that vary with different semiconductor processes.

Accordingly, the gas feeder 104 (including e.g., an arrangement of nozzles) may be disposed at an upper portion (e.g., at the ceiling or upper side) of the chamber 100. Alternately, the gas feeder 104 may be disposed at the lower electrode 110. The gas feeder 104 may be grounded through the grounding line 103. With this configuration, the gas feeder 104 may provide gas (e.g., a single gas, a mixture of two or more gases, or a sequence of different gases) toward an upper surface of the wafer 10 seated on the lower electrode 110, and in this manner, the gas feeder 104 may provide gas used to generate a plasma within at least the upper portion of the chamber 100. In some embodiments, the gas feeder 104 may include (or be combined with) an upper electrode associated with the plasma process, or the gas feeder 104 may directly act as the upper electrode.

In this regard, for example, the plasma process for which the plasma is generated, may be a dry etching process applied to the upper surface of the wafer 10.

The gas supply line 106 may connect an external gas source 105 with the gas feeder 104 through the ceiling of the chamber 100 in order to provide the gas used to generate the plasma to at least the upper portion of the chamber 100. Although FIG. 1 shows that the gas supply line 106 located through the ceiling of the chamber 100, those skilled in the art will recognize that gas may be otherwise provided to the chamber 100, and the position of the gas supply line 106 may vary depending on the structure and layout of the chamber 100 and/or the structure and layout of the gas source 105.

In this regard, the gas source 105 may store one or more gas(es) that may be used to generate plasma within the chamber 100. Although FIG. 1 shows that the external gas source 105 providing gas through the gas supply line 106, embodiments of the inventive concept are not limited thereto, and alternately, the gas source 105 may be integrated with, or directly attached to the chamber 100.

The lower electrode 110 disposed in the chamber 100 may include an upper surface 110b and an opposing lower surface 110a, wherein the wafer 10 may be seated on the upper surface 110b of the lower electrode 110. In this manner, the lower electrode 110 may chuck the wafer 10 using a voltage applied to the lower electrode 110.

The RF rod 120 may be disposed below the lower electrode 110. That is, in some embodiments, the RF rod 120 may be disposed on the second surface 110a of the lower electrode 110. The RF rod 120 may extend in a vertical direction DR3 relative to the upper and lower surfaces of the lower electrode 110 which are assumed to extend in horizontal directions DR1 and DR2. Although FIG. 1 shows that the RF rod 120 vertically penetrating the floor (or lower side) of the chamber 100, embodiments of the inventive concept are not limited thereto.

The RF plate 130 may be disposed between the lower surface 110a of the lower electrode 110 and the RF rod 120, and may be connected between the lower surface 110a of the lower electrode 110 and the RF rod 120.

Figure 7:
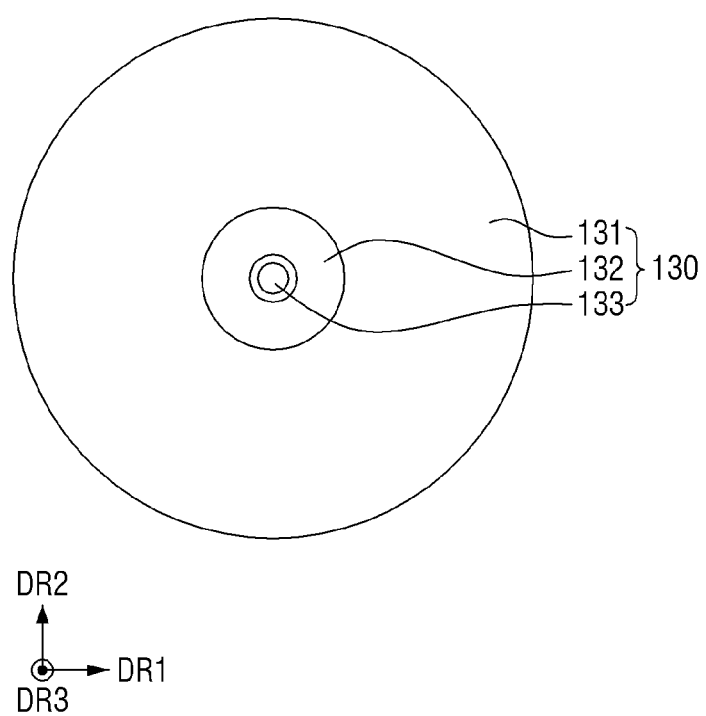
FIG. 7 is a plan view illustrating an RF plate of the plasma processing apparatus according to embodiments of the inventive concept.
Figure 9:
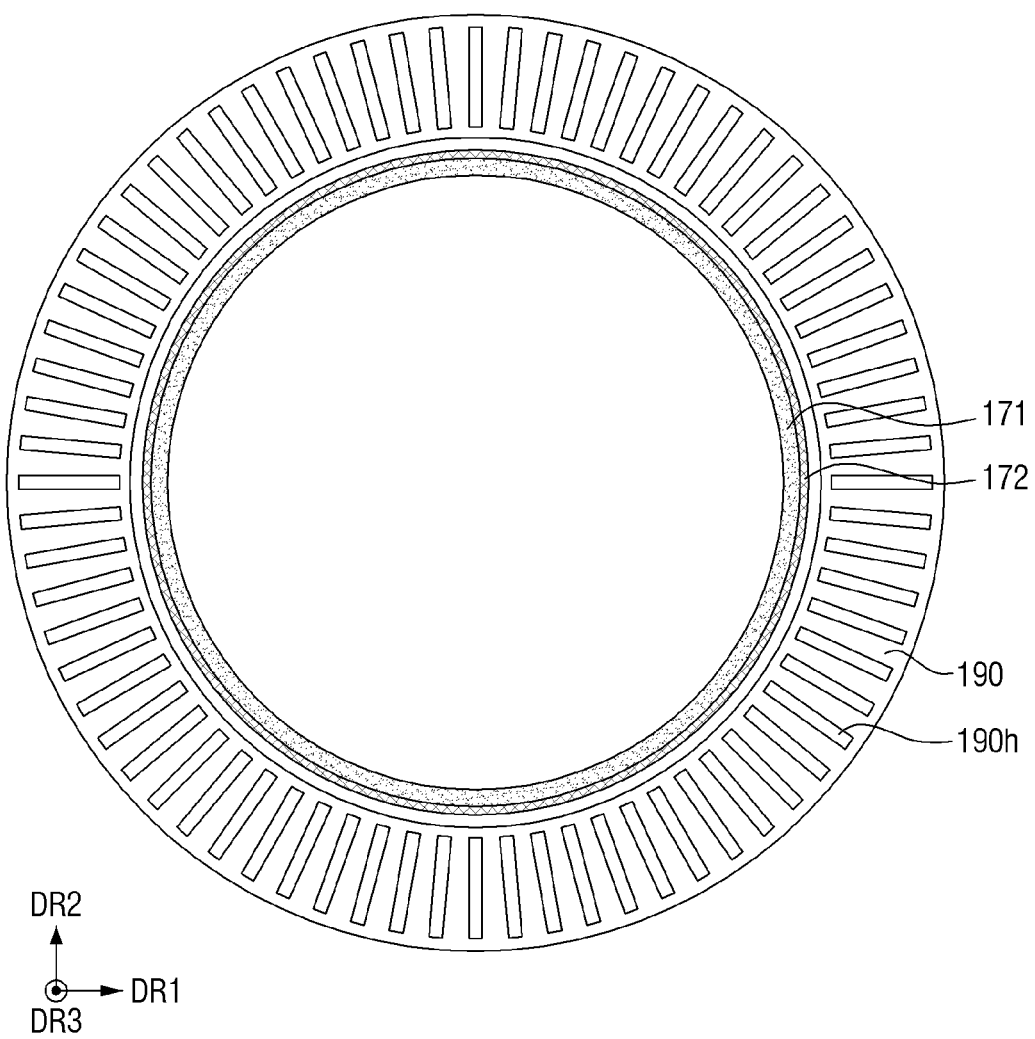
FIG. 9 is a plan view illustrating a baffle unit of the plasma processing apparatus according to embodiments of the inventive concept.

As illustrated in some additional detail in FIG. 7, the RF plate 130 may have a disk shape, wherein the disk extends outwardly in the horizontal directions DR1 and DR2 from a center point. However, embodiments of the inventive concept are not limited thereto.

In some embodiments, the RF plate 130 may include first, second and third portions 131, 132, and 133. The first portion 131 of the RF plate 130 may contact the lower surface 110a of the lower electrode 110. Although FIG. 1 shows a "width" (hereafter, a distance measured in the first horizontal direction DR1) of the first portion 131 of the RF plate 130 being about the same as a width of the lower electrode 110, however embodiments of the inventive concept are not limited thereto. In other embodiments, the width of the first portion 131 of the RF plate 130 may be different from the width of the lower electrode 110.

The second portion 132 of the RF plate 130 may extend downwardly from the first portion 131 of the RF plate 130 towards the RF rod 120. Here, in some embodiments, the width of the second portion 132 of the RF plate 130 may decrease as it extends downwardly towards the RF rod 120. Accordingly, a side wall of the second portion 132 of the RF plate 130 may have a curved shape. That is, the side wall of the second portion 132 of the RF plate 130 may curve downwardly and inwardly towards a center of the RF plate 130, however embodiments of the inventive concept are not limited thereto. In some embodiments, for example, the side wall of the second portion 132 of the RF plate 130 may curved outwardly to form convex shape with respect to the center of the RF plate 130.

The third portion 133 of the RF plate 130 may extend downwardly from a lower end of the second portion 132 of the RF plate 130 towards the RF rod 120. With this configuration, the RF plate 130 may be connected to the RF rod 120 through the third portion 133 of the RF plate 130. In some embodiments, the third portion 133 of the RF plate 130 may be inserted into the RF rod 120, however embodiments of the inventive concept are not limited thereto. In this regard, the width of the third portion 133 of the RF plate 130 may be less than the width of the second portion 132 of the RF plate 130. Here, the RF plate 130 may include one or more conductive material(s), such as aluminum (Al), but embodiments of the inventive concept are not limited thereto.

The power supply 101 (e.g., an alternating current (AC) power supply) may be connected to the RF rod 120. Accordingly, the power supply 101 may provide a bias voltage and/or an RF signal associated with the plasma process to the RF rod 120. The bias voltage and the RF signal provided to the RF rod 120 may be provided through the lower electrode 110 and the RF plate 130. Plasma generated during the plasma process may reach the upper surface of the wafer 10 under the influence of an electric field. That is, since the plasma includes ionized particles having electric charge, the plasma will flow in a desired direction (e.g., in a vertical direction) as defined by the developed electric field.

The matcher 102 may be used to connect the power supply 101 to the RF rod 120. Hence, the matcher 102 will be located between the power supply 101 and the RF rod 120. In this regard, the matcher 102 may be used to selectively transfer one or more desired frequencies to the RF rod 120 (e.g., through the use of capacitors) and block other frequencies.

The grounding electrode 140 may surround at least part of a combination of the side wall of the RF rod 120 and the side wall of the second portion 132 of the RF plate 130. In this regard, the grounding electrode 140 may be separated from the side wall of the second portion 132 of the RF plate 130 and/or from the side wall of the RF rod 120. IN some embodiments, the grounding electrode 140 may include first, second and third grounding electrodes 141, 142, and 143.

Referring to FIGS. 2 to 6, as examples, a first grounding electrode 141 may extend along the side wall of the RF rod 120 and the side wall of the second portion 132 of the RF plate 130. In some embodiments, the first grounding electrode 141 may include a first side wall portion 141_1 and at least one first wing portion 141_2. Here, the first side wall portion 141_1 may extend substantially in the vertical direction DR3 along the side wall of the RF rod 120, however the first side wall portion 141_1 may be separated (or distanced) from the RF rod 120. In some embodiments, the first side wall portion 141_1 may have a cylindrical shape with an open interior.

Figure 2:
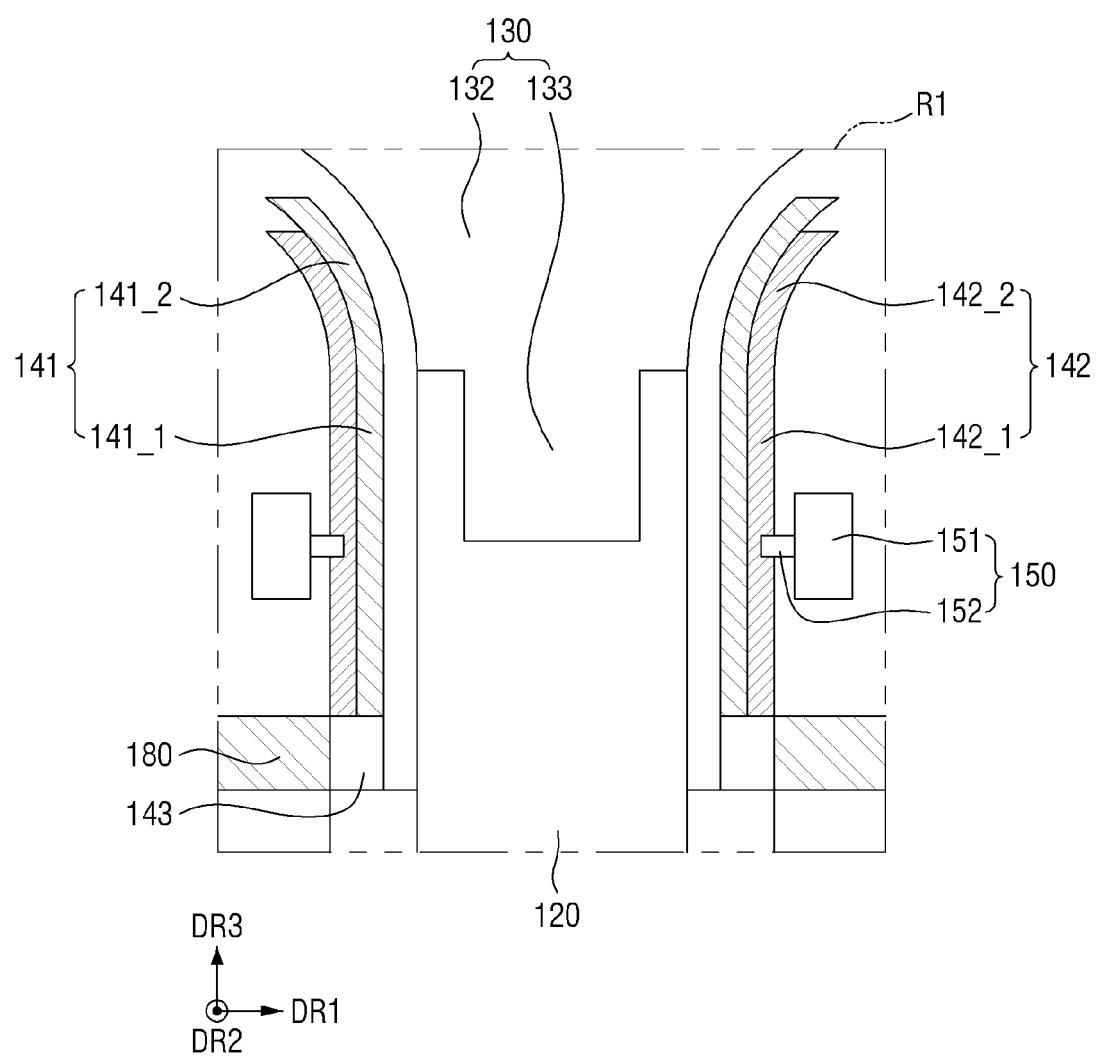
FIG. 2 is an enlarged view of region 'R1' indicated in FIG. 1.
Figure 5:
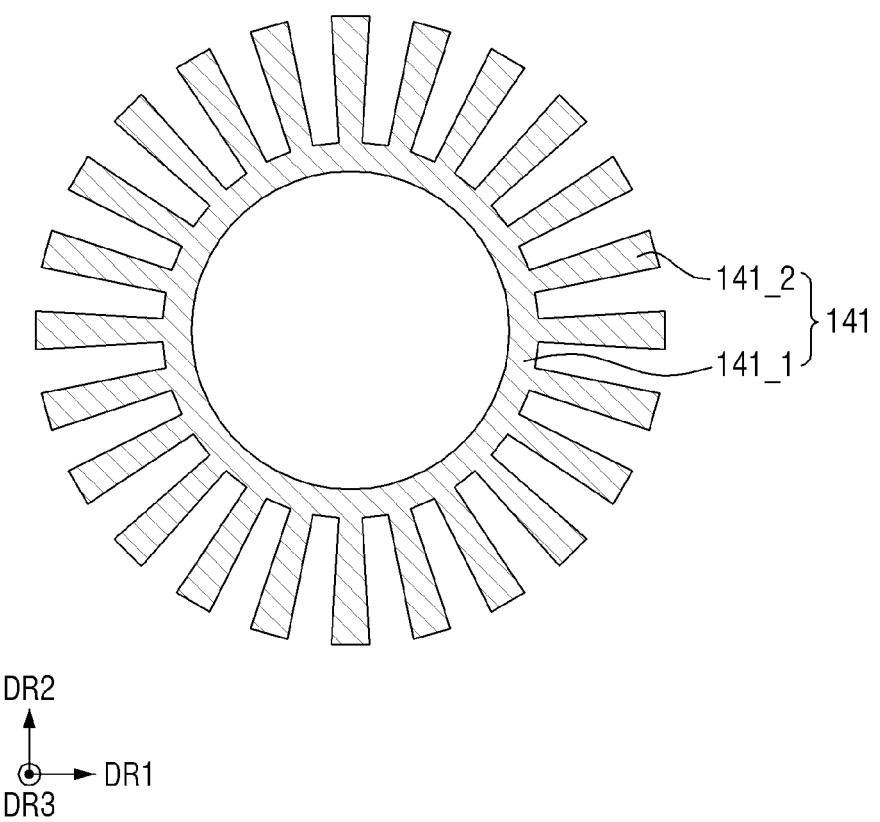
FIGS. 5 and 6 are respective plan views further illustrating operation of the grounding electrode of the plasma processing apparatus according to embodiments of the inventive concept.
Figure 6:
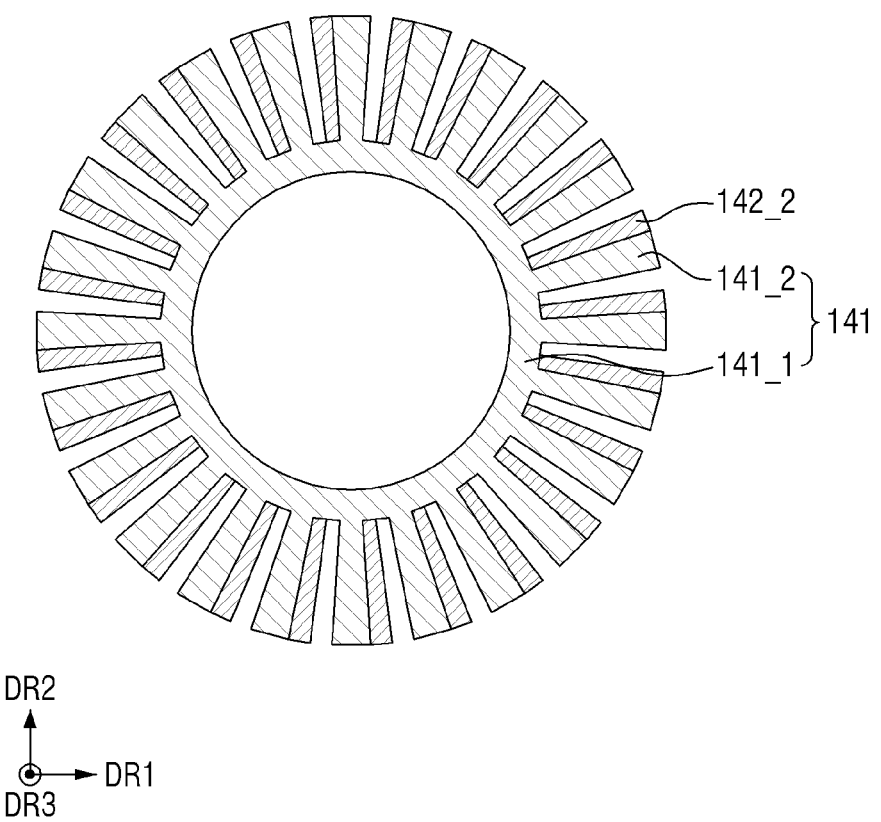

Referring to FIGS. 2, 3 and 5, each of the first wing portions 141_2 may extend laterally outward from the first side wall portion 141_1 which is substantially vertical in its extension. In some embodiments, each of the first wing portions 141_2 may partially extend along the side wall of the second portion 132 of the RF plate 130, and curve outwardly towards an outer edge of the first portion 131 of the RF plate 130. In this regard, however, the first wing portions 141_2 may be separated from the side wall of the second portion 132 of the RF plate 130 and be separated one from another.

A second grounding electrode 142 may substantially surround the first grounding electrode 141, and include a second side wall portion 142_1 and at least one second wing portions 142_2.

The second side wall portion 142_1 may extend substantially in the vertical direction DR3 along the side wall of the first side wall portion 141_1 and may contact the first side wall portion 141_1, however embodiments of the inventive concept are not limited thereto. Alternately, the second side wall portion 142_1 may be separated from the first side wall portion 141_1. The second side wall portion 142_1 may have a cylindrical shape with an open interior.

Each of the second wing portions 142_2 may laterally extend away from an outer peripheral surface of the second side wall portion 142_1. For example, each of the second wing portions 142_2 may (at least partially) extend along the side wall of the second portion 132 of the RF plate 130, and then curve outwardly towards the outer edge of the first portion 131 of the RF plate 130. Each of the second wing portions 142_2 may be separated from the second portion 132 of the RF plate 130 and/or separated from each other.

Here, a second "height" (hereafter, a distance measured in the vertical direction DR3) of the second grounding electrode 142 may be less than a first height of the first grounding electrode 141. That is, the first wing portions 141_2 of the first grounding electrode 141 may be disposed closer to the second portion 132 of the RF plate 130 than the second wing portions 142_2 of the second grounding electrode 142.

Thus, a second diameter of the second side wall portion 142_1 may be greater than a first diameter of the first side wall portion 141_1, thereby allowing the first side wall portion 141_1 to be inserted within the second side wall portion 142_1.

With this configuration, the second grounding electrode 142 may be rotated in a horizontal plane (e.g., a plane defined by the first horizontal direction DR1 and the second horizontal direction DR2). For example, assuming that the first wing portions 141_2 and the second wing portions 142_2 are vertically aligned, by rotating the second grounding electrode 142, each of the second wing portions may be disposed between adjacent ones of the first wing portions 141_2. As a result, an area of the grounding electrode 140 facing the second portion 132 of the RF plate 130 may be adjusted by rotating the second grounding electrode 142. Accordingly, as the area of the grounding electrode 140 facing the second portion 132 of the RF plate 130 increases, a first etch rate associated with a central portion of the wafer 10 will also increase, and as the area of the grounding electrode 140 facing the second portion 132 of the RF plate 130 decreases, the first etch rate will also decrease. In this manner, the area of the grounding electrode 140 facing the second portion 132 of the RF plate 130 may be adjusted to control the first etch rate, thereby controlling an amount etched from the central portion of the wafer 10.

A third grounding electrode 143 may be disposed below a combination of the first grounding electrode 141 and the second grounding electrode 142, and the third grounding electrode 143 may be respectively connected to the first grounding electrode 141 and the second grounding electrode 142. In some embodiments, the third grounding electrode 143 may have a ring shape.

The guide portion 150 may surround the side wall of the grounding electrode 140. Specifically, the guide portion 150 may surround the second side wall portion 142_1 of the second grounding electrode 142. The guide portion 150 may be connected to the second side wall portion 142_1 of the second grounding electrode 142.

The guide portion 150 may include a guide ring 151 and a guide pin 152, wherein the guide ring 151 at least partially surrounds the second side wall portion 142_1 of the second grounding electrode 142. In some embodiments, the guide ring 151 may have a ring shape.

The guide pin 152 may protrude from the guide ring 151 towards the second side wall portion 142_1 of the second grounding electrode 142. Two guide pins 152 may be spaced apart, for example, in the first horizontal direction DR1.

Figure 4:
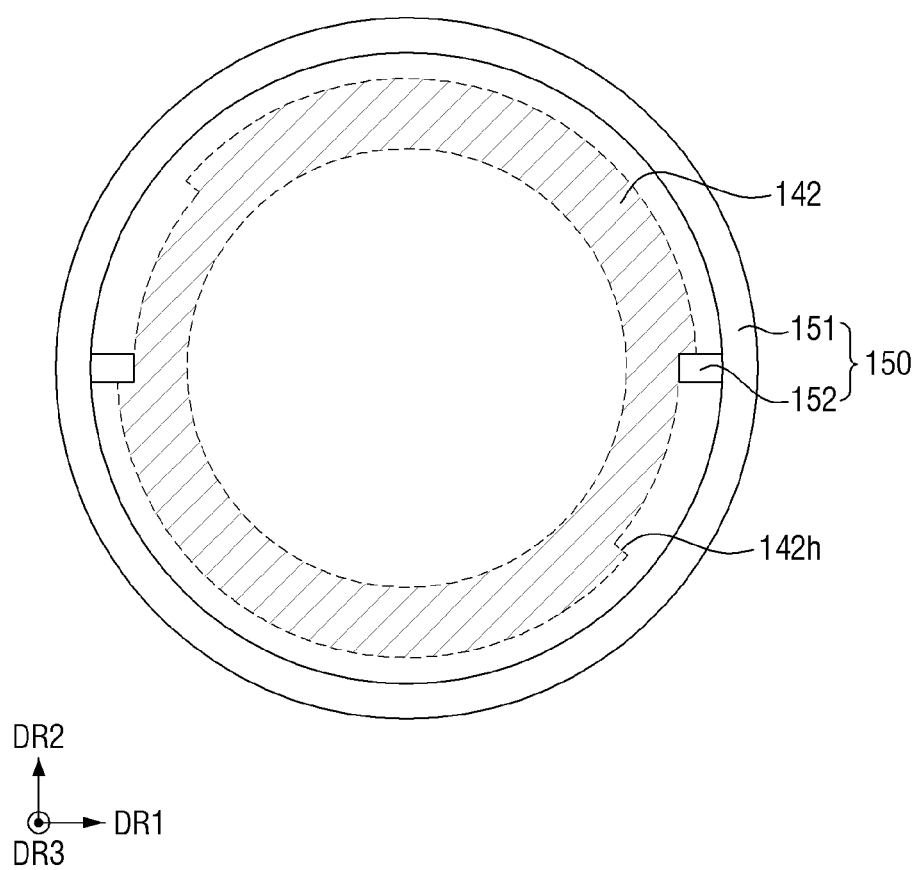
FIG. 4 is a plan (or top-down) view illustrating a guide portion of the plasma processing apparatus according to embodiments of the inventive concept.

As shown in FIG. 4, a portion of the guide pin 152 may be inserted into a guide groove 142h formed in the second side wall portion 142_1 of the second grounding electrode 142. As shown in FIG. 3, the guide groove 142h may extend in an upward slope from a lower portion of the second side wall portion 142_1 of the second grounding electrode 142 towards an upper portion of the second side wall portion 142_1 of the second grounding electrode 142. For example, two guide grooves 142h may be formed on opposing points along outer walls of the second side wall portion 142_1 of the second grounding electrode 142.

The guide portion 150 connected to the guide groove 142h having an upward slope may be driven in the vertical direction DR3, and may rotate the second grounding electrode 142 around a horizontal plane.

The insulating plate 160 may at least partially surround the side wall of the lower electrode 110 and the side wall of the first portion 131 of the RF plate 130. Although at least a part of the insulating plate 160 may contact the lower surface of the first portion 131 of the RF plate 130, embodiments of the inventive concept are not limited thereto. Here, the insulating plate 160 may include one or more insulating material(s).

The focus ring 161 may be disposed on the upper surfaces of each of the insulating plate 160 and the lower electrode 110. The focus ring 161 may surround a partial side wall of the upper part of the lower electrode 110. The focus ring 161 may have a ring shape and may be "horizontally disposed" (e.g., may be positioned in an arbitrary plane defined by the first and second horizontal directions DR1 and DR2). Here, the focus ring 161 may include one or more insulating material(s).

The insulator ring 171 may at least partially surround the side wall of the insulating plate 160 and contact the side wall of the insulating plate 160. The insulator ring 171 may be separated from the focus ring 161. In some embodiments, the insulator ring 171 may have a ring shape and be horizontally disposed. The insulator ring 171 may include one or more insulating material(s).

The conductor ring 172 may at least partially surround the side wall of the insulator ring 171 and contact the side wall of the insulator ring 171. At least a portion of the conductor ring 172 may be disposed on the lower surface of the insulator ring 171. The conductor ring 172 may be disposed below the insulator ring 171 in contact with the side wall of the insulating plate 160.

The conductor ring 172 may be separated from the focus ring 161. In some embodiments, the conductor ring 172 may have a ring shape and may be horizontally. The conductor ring 172 may include one or more conductive material(s).

Since the conductor ring 172 insulated from each of the lower electrode 110 and the RF plate 130 is disposed to surround side walls of each of the lower electrode 110 and the RF plate 130, a second etch rate associated with an edge portion of the wafer 10 may be increased.

The edge ring 162 may be disposed on the upper surfaces of each of the insulating plate 160, the insulator ring 171 and the conductor ring 172. The edge ring 162 may surround the side walls of the focus ring 161. The edge ring 162 may contact each of the insulating plate 160, the focus ring 161, the insulator ring 171, and the conductor ring 172. In some embodiments, the edge ring 162 may have a ring shape and may be horizontally disposed. The edge ring 162 may include one or more insulating material(s).

The grounding plate 180 may be disposed below each of the insulating plate 160, the RF plate 130, and the conductor ring 172. The grounding plate 180 may contact each of the insulating plate 160, the conductor ring 172, and the grounding electrode 140. The grounding plate 180 may also contact (e.g.,) the third grounding electrode 143 and/or the floor of the chamber 100. In this regard, the grounding plate 180 may include one or more conductive material(s).

The baffle unit 190 may be disposed between the conductor ring 172 and a side wall of the chamber 100. The baffle unit 190 may have a ring shape and be horizontally disposed.

Although the baffle unit 190 may contact the side wall of the chamber 100, embodiments of the inventive concept are not limited thereto and alternately, the baffle unit 190 may be separated from the side wall of the chamber 100. The baffle unit 190 may be separated from the insulator ring 171 and separated from the conductor ring 172. Since the baffle unit 190 is disposed apart from the conductor ring 172, the second etch rate may be increased.

The baffle unit 190 may include multiple baffle holes 190h penetrating the baffle unit 190 (e.g., in the vertical direction DR3). Here, the baffle holes 190h are separated one from another in order to facilitate the flow (e.g., injection and/or exhaust) of gas within the chamber 100.

Hereinafter, methods of fabricating semiconductor devices using plasma processing apparatus(es) according to embodiments of the inventive concept will be described.

Figure 10:
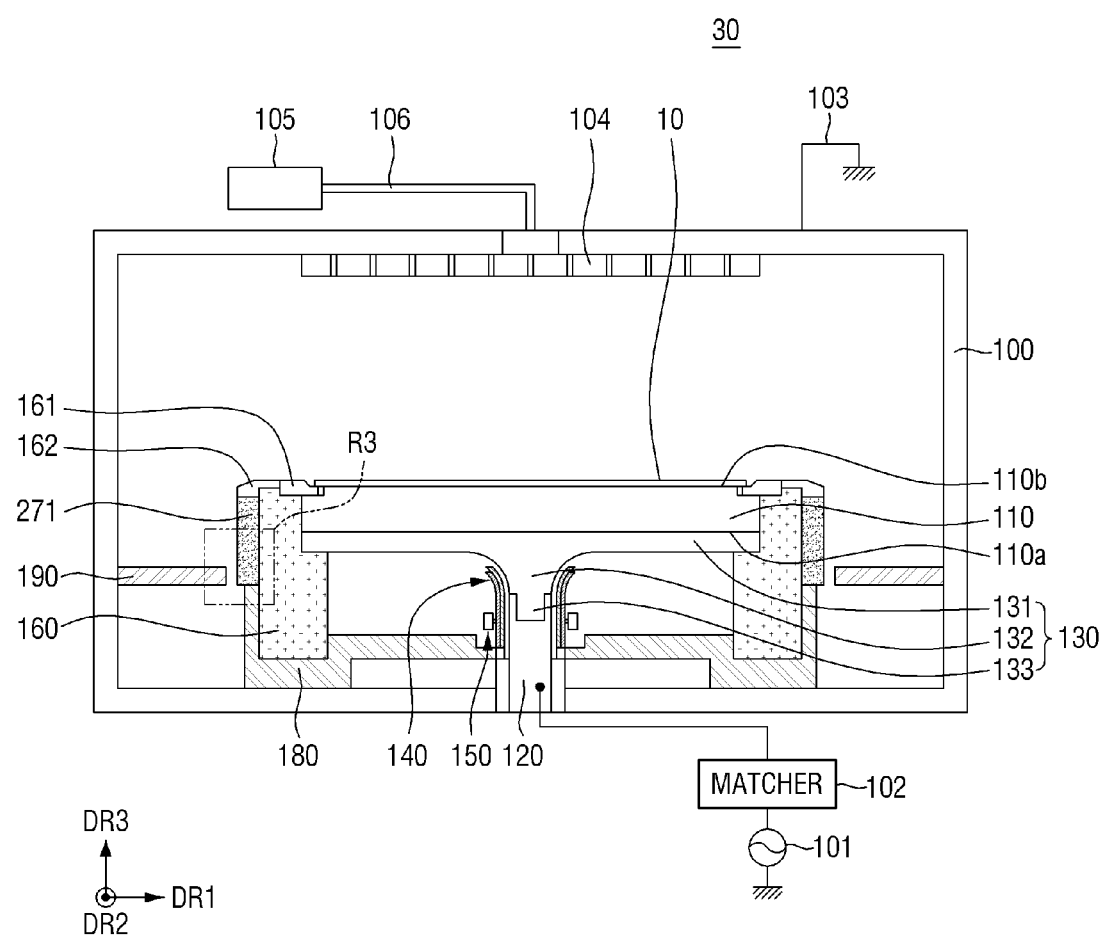
FIG. 10 is a flowchart illustrating in one example a method of fabricating a semiconductor device using the plasma processing apparatus according to embodiments of the inventive concept.

FIG. 10 is a flowchart illustrating in one example a method of fabricating a semiconductor device using the plasma processing apparatus 20 previously described in relation to FIGS. 1 to 9.

Referring to FIGS. 1 to 10, the wafer 10 may be appropriately seated within the chamber 100 in relation to the RF plate 130 (S110). For example, the wafer 10 may be seated on the upper surface 100b of the lower electrode 110 which is disposed on the RF plate 130.

Once the wafer 10 is seated, a plasma etching process may be performed. Accordingly, the area of the grounding electrode 140 facing the RF plate 130 may be adjusted to define an "etching amount" (e.g., an etch rate) applied to the central portion of the wafer 10 (S120). In this regard, the second grounding electrode 142 may be horizontally rotated to adjust the area of the grounding electrode 140 facing the second portion 132 of the RF plate 130.

For example, in order to increase the etch rate applied to the central portion of the wafer 10, the area of the grounding electrode 140 facing the RF plate 130 may be increased. In this case, by rotating the second grounding electrode 142, each of the second wing portions 142_2 of the second grounding electrode 142 may be positioned between adjacent ones of the first wing portions 141_2 of the first grounding electrode 141.

Alternately, in order to reduce the etch rate applied to the central portion of the wafer 10, the area of the grounding electrode 140 facing the RF plate 130 may be reduced. In this case, by rotating the second grounding electrode 142, each of the second wing portions 142_2 of the second grounding electrode 142 may be positioned in vertical alignment (or in partial vertical alignment) with one of the first wing portions 141_2 of the first grounding electrode 141.

The area adjustment of the grounding electrode 140 facing the RF plate 130 may be performed before and/or during the plasma etching of the wafer 10.

In this regard, plasma etching apparatuses according to embodiments of the inventive concept, as well as methods of fabricating semiconductor devices using same, may effectively control the etching amount of a plasma etching process applied of the central portion of the wafer 10 by adjusting an area of the grounding electrode 140 facing the second portion 132 of the RF plate 130.

Alternately or additionally, plasma etching apparatuses according to embodiments of the inventive concept and methods of fabricating semiconductor devices using same, may marginally increase the etching amount of a plasma etching process applied to the edge portion of the wafer 10 by positioning the conductor ring 172 (insulated from both the lower electrode 110 and the RF plate 130) to at least partially surround the respective side walls of the lower electrode 110 and the RF plate 130. Here, since the baffle unit 190 is spaced apart from the conductor ring 172, the etching amount applied to the edge portion of the wafer 10 may be increased.

That is, plasma etching apparatuses according to embodiments of the inventive concept and methods of fabricating semiconductor devices using same, may improve the overall reliability (e.g., more particularly defining an etching amount for central and/or edge portions of a wafer) of a plasma etching process by (1) adjusting the area of the grounding electrode 140 facing the second portion 132 of the RF plate 130, (2) positioning of the conductor ring 172 relative to side walls of the lower electrode 110 and/or the RF plate 130, and (3) configuring (e.g., spacing apart) the baffle unit 190 with respect to the conductor ring 172.

Hereinafter, various plasma processing apparatuses according to embodiments of the inventive concept will be described in relation to FIGS. 11, 12 and 13. Here, only material differences between the plasma processing apparatus of FIGS. 1 to 9 and the plasma processing apparatuses described in relation to FIGS. 11, 12 and 13 will be emphasized.

Figure 11:
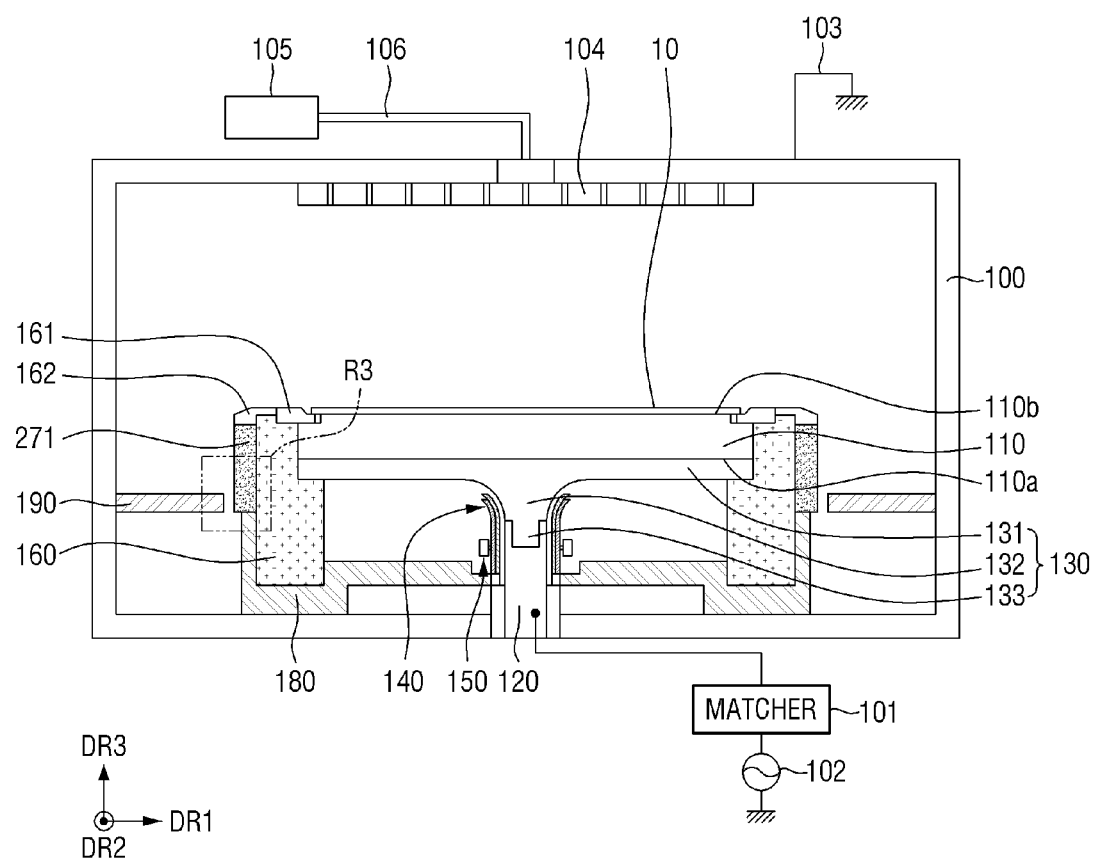
FIG. 11 is a side view illustrating a plasma processing apparatus according to embodiments of the inventive concept.
Figure 12:
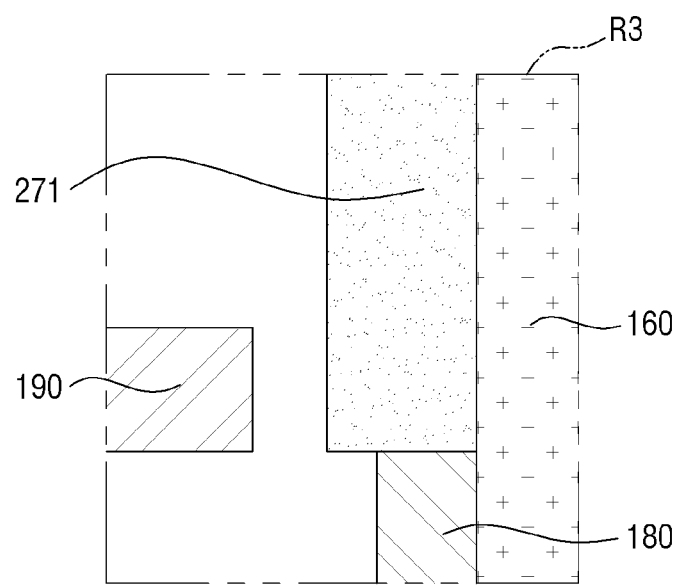
FIG. 12 is an enlarged view of region 'R3' indicated in FIG. 11.
Figure 13:
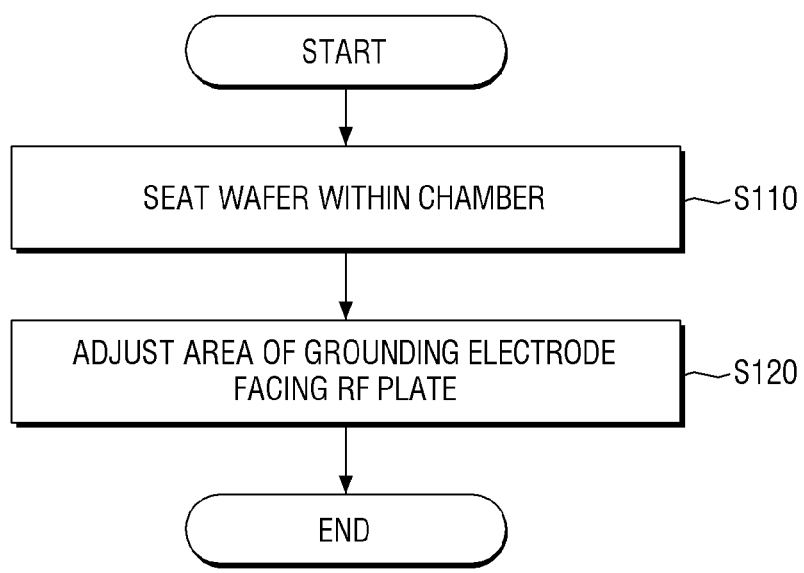
FIG. 13 is a plan view illustrating a baffle unit of the plasma processing apparatus according to embodiments of the inventive concept.

FIG. 11 is a side view illustrating a plasma processing apparatus 30 according to embodiments of the inventive concept, FIG. 12 is an enlarged view of region 'R3' indicated in FIG. 11, and FIG. 13 is a plan view further illustrating a baffle unit of the plasma processing apparatus according to embodiments of the inventive concept.

Referring to FIGS. 11, 12 and 13, a conductor ring (like the conductor ring 172 of FIG. 1) is not disposed in the plasma processing apparatus 30. Rather, an insulator ring 271 may be positioned to at least partially surround the side wall of the insulating plate 160. Here, the insulator ring 271 may contact the side wall of the insulating plate 160, may be separated from the focus ring 161, may have a ring shape, may be horizontally positioned, and/or may include one or more insulating material(s).

A baffle unit 190 may be disposed between the insulator ring 271 and the side wall of the chamber 100. The baffle unit 190 may have a ring shape, may be horizontally positioned, and/or may be separated from the insulator ring 271.

Figure 14:
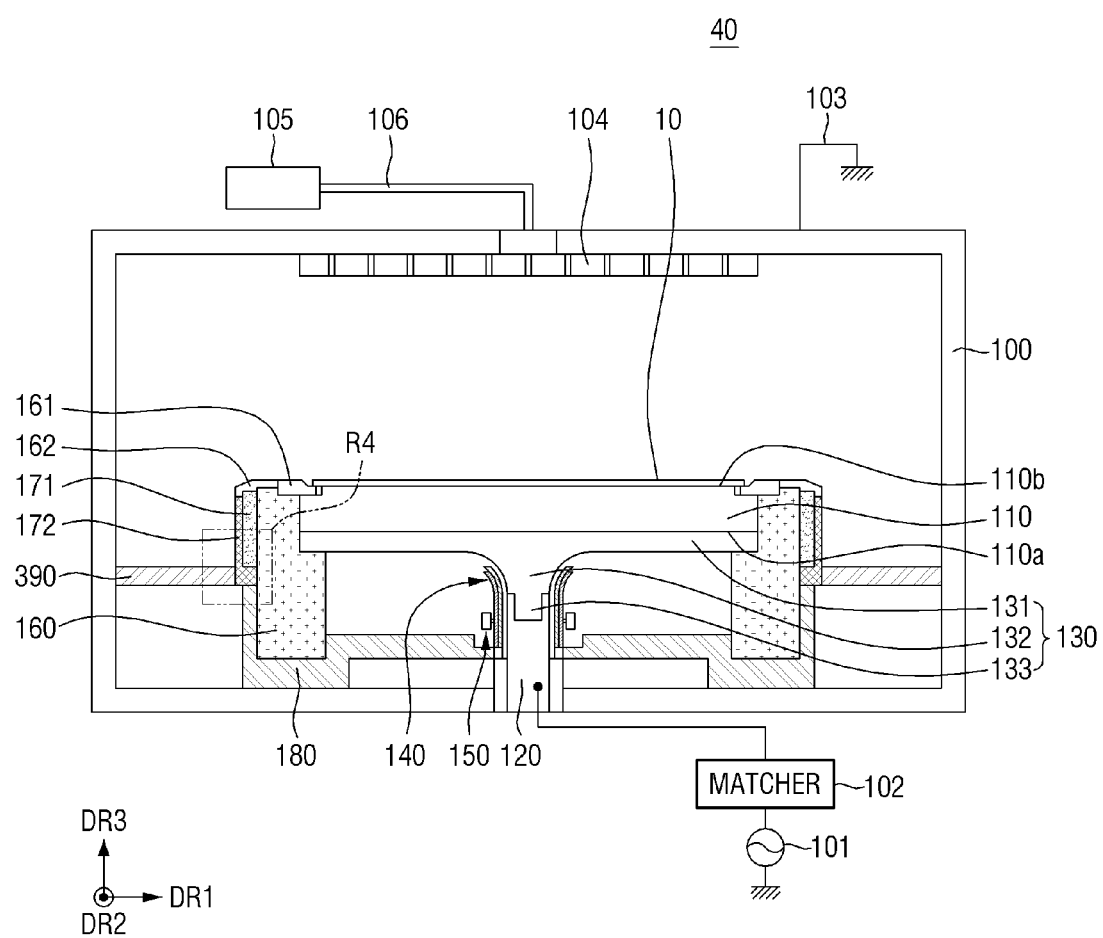
FIG. 14 is a side view illustrating a plasma processing apparatus according to embodiments of the inventive concept and FIG. 15 is an enlarged view of region 'R4' indicated in FIG. 14.
Figure 15:
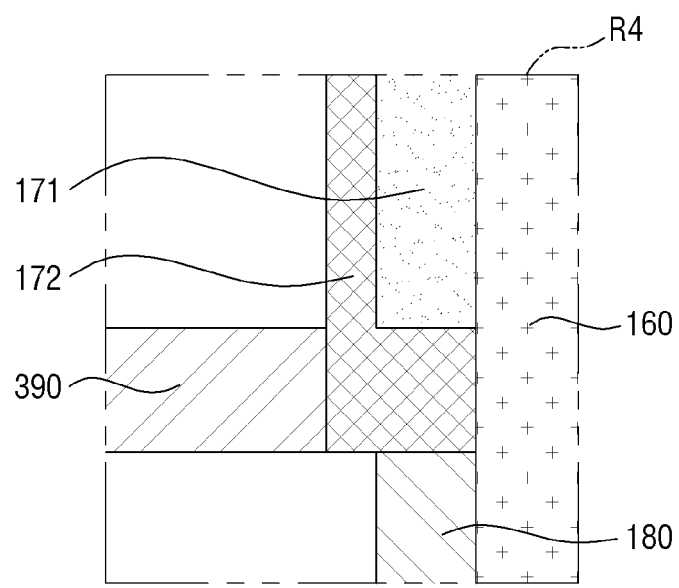

FIG. 14 is a side view illustrating a plasma processing apparatus 40 according to embodiments of the inventive concept, and FIG. 15 is an enlarged view of region 'R4' indicated in FIG. 14.

Referring to FIGS. 14 and 15, within the plasma processing apparatus 40, a baffle unit 390 may contact the outer side wall of the conductor ring 172.

Here, the baffle unit 390 may be disposed between the conductor ring 172 and a side wall of the chamber 100. The baffle unit 390 may have a ring shape and may be horizontally positioned.

Although the baffle unit 390 contacts the side wall of the chamber 100 in the illustrated example of FIG. 14, embodiments of the inventive concept are not limited thereto. In some embodiments, the baffle unit 390 may be separated from the side wall of the chamber 100 and/or may be separated from the insulator ring 171.

Figure 16:
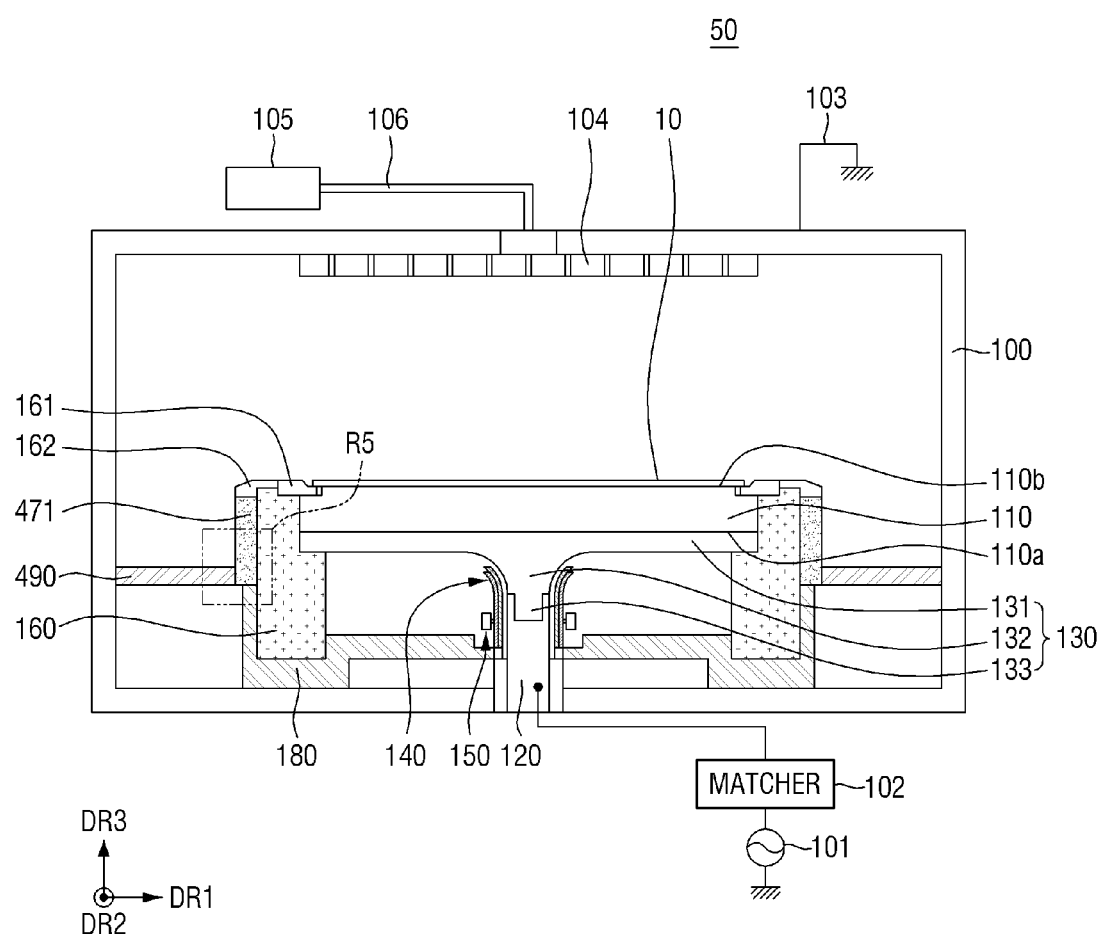
FIG. 16 is a side view illustrating a plasma processing apparatus according to embodiments of the inventive concept.
Figure 17:
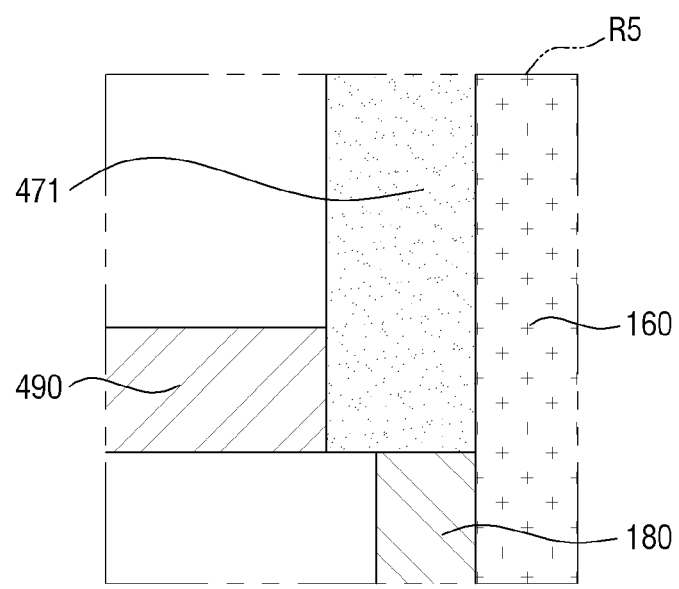
FIG. 17 is an enlarged view of region 'R5' indicated in FIG. 16.

FIG. 16 is a side view of a plasma processing apparatus 50 according to embodiments of the inventive concept, and FIG. 17 is an enlarged view of region 'R5' indicated in FIG. 16.

Referring to FIGS. 16 and 17, a conductor ring (like the conductor ring 172 of FIG. 1) is not disposed in the plasma processing apparatus 50. Rather, a baffle unit 490 may contact the outer side wall of the insulator ring 471.

Here, the insulator ring 471 may at least partially surround the side wall of the insulating plate 160, may contact the side wall of the insulating plate 160, may be separated from the focus ring 161, may have a ring shape, may be horizontally disposed, and/or may include one or more insulating material(s).

A baffle unit 490 may be disposed between the insulator ring 471 and the side wall of the chamber 100, may have a ring shape, and/or may be horizontally disposed.

Although the baffle unit 490 may contact the side wall of the chamber 100, the inventive concept is not limited thereto, and in other embodiments, the baffle unit 490 may be separated from the side wall of the chamber 100.

Figure 18:
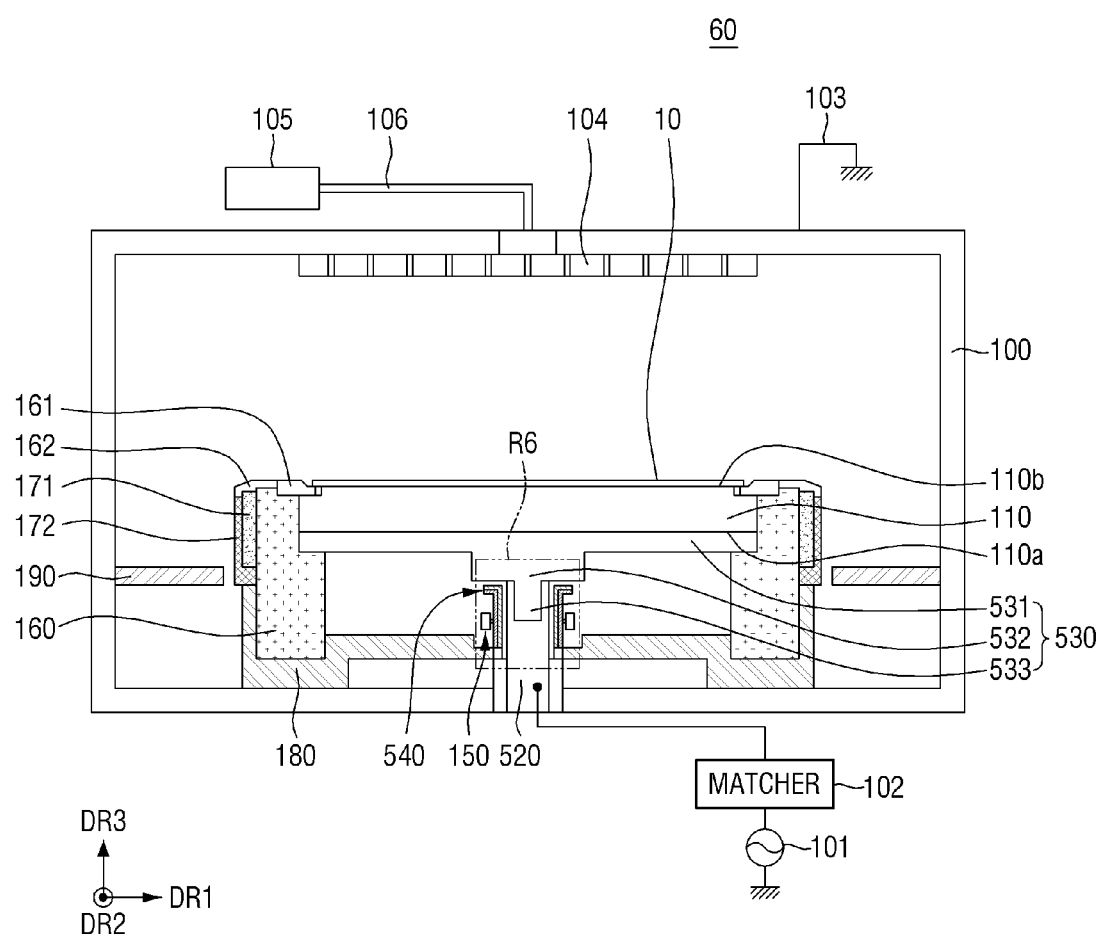
FIG. 18 is a side view illustrating a plasma processing apparatus according to embodiments of the inventive concept.
Figure 19:
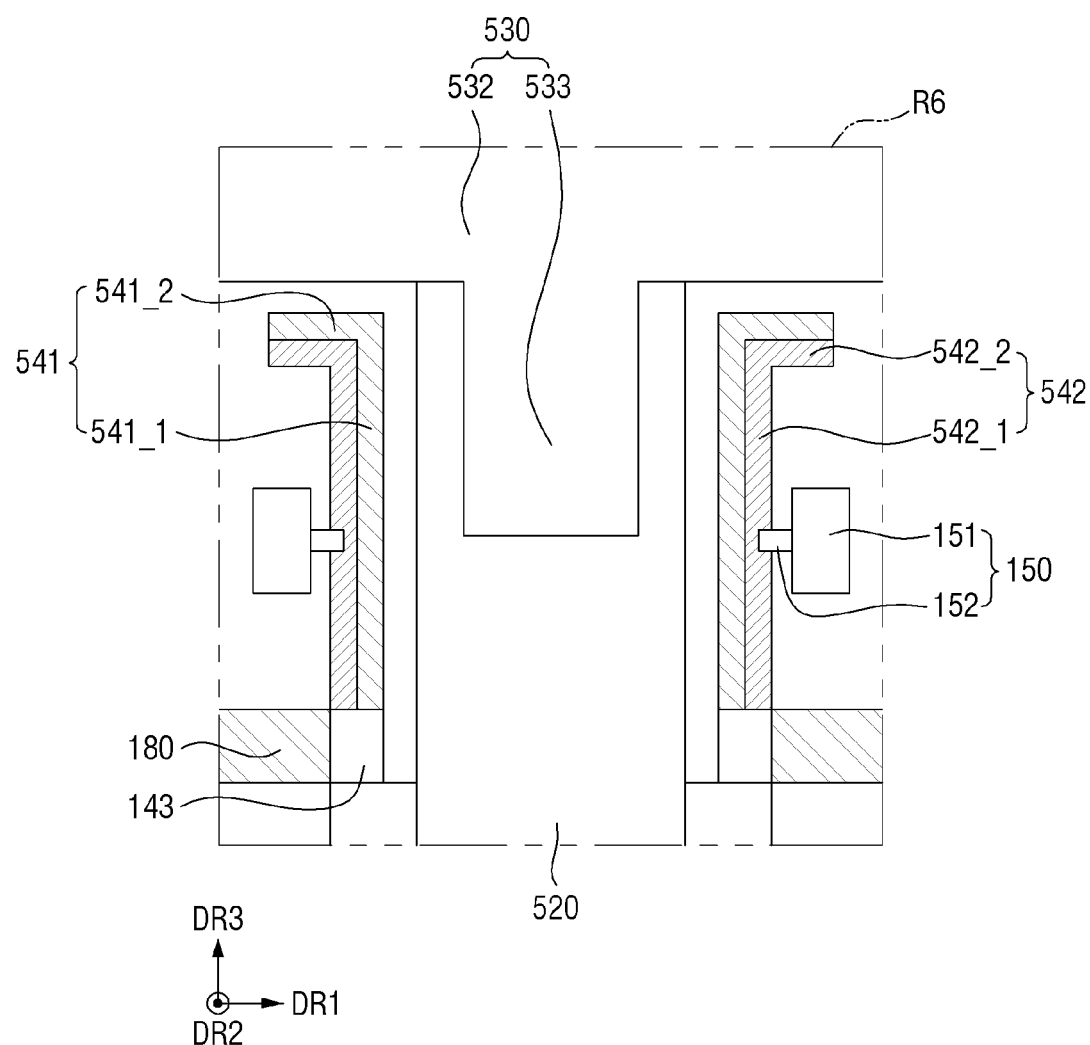
FIG. 19 is an enlarged view of region 'R6' indicated in FIG. 18.

FIG. 18 is a side view illustrating a plasma processing apparatus 60 according to embodiments of the inventive concept, and FIG. 19 is an enlarged view of region 'R6' of FIG. 18.

Referring to FIGS. 18 and 19, in the plasma processing apparatus 60, side walls of a second portion 532 of an RF plate 530 may vertically extend. That is, the side walls of the second portion 532 of the RF plate 530 may extend in the vertical direction DR3.

For example, the RF plate 530 may include first, second and third portions 531, 532, and 533, wherein the first portion 531 and the underlying second portion 532 of the RF plate 530 at least partially contact the lower surface 110a. The third portion 533 of the RF plate 530 extends downward from the second portion 532 of the RF plate 530 towards the RF rod 120.

The RF plate 530 may be connected to the RF rod 520 through the third portion 533 of the RF plate 530. For example, the third portion 533 of the RF plate 530 may be inserted into the RF rod 520, however embodiments of the inventive concept are not limited thereto.

The grounding electrode 540 may be disposed below the second portion 532 of the RF plate 530. The grounding electrode 540 may surround a part of the side wall of the RF rod 520. The grounding electrode 540 may be separated from the lower surface of the second portion 532 of the RF plate 530. Also, the grounding electrode 540 may be separated from the side wall of the RF rod 520. The grounding electrode 540 may comprise first, second and third grounding electrodes 541, 542, and 143.

The first grounding electrode 541 may be disposed to face the side wall of the RF rod 520. The first grounding electrode 541 may include a first side wall portion 541_1 and first wing portions 541_2.

The first side wall portion 541_1 may extend in the vertical direction DR3 along the side wall of the RF rod 520. The first side wall portion 541_1 may be separated from the RF rod 520. The first side wall portion 541_1 may have a cylindrical shape with an open interior.

Each of the first wing portions 541_2 may extend horizontally (or laterally) from the outer peripheral surface of the first side wall portion 541_1. For example, each of the first wing portions 541_2 may extend with a flat, constant slope along the lower surface of the second portion 532 of the RF plate 530. Each of the first wing portions 541_2 may be separated from the lower surface of the second portion 532 of the RF plate 530, and may be separated one from another.

The second grounding electrode 542 may at least partially surround the first grounding electrode 541. The second grounding electrode 542 may comprise a second side wall portion 542_1 and second wing portions 542_2.

The second side wall 542_1 may extend in the vertical direction DR3 along the side wall of the first side wall portion 541_1. The second side wall portion 542_1 may contact the first side wall portion 541_1, however embodiments of the inventive concept are not limited thereto. In some embodiments, the second side wall 542_1 may be separated from the first side wall portion 541_1. The second side wall portion 542_1 may have a cylindrical shape with an open interior.

Each of the second wing portions 542_2 may extend horizontally from the outer peripheral surface of the second side wall portion 542_1. For example, each of the second wing portions 542_2 may extend with a flat, constant slope along the side wall of the second portion 532 of the RF plate 530. Each of the second wing portions 542_2 may be separated from the lower surface of the second portion 532 of the RF plate 530. Also, each of the second wing portions 542_2 may be separated one from another.

Although the certain embodiments of the inventive concept have been described with reference to the accompanying drawing, the inventive concept, as defined by the following claims, is not limited to only these embodiments. Those skilled in the art will appreciate that the inventive concept may be variously implemented in other specific forms without removing such changes and modifications from the scope of the inventive concept.

What is claimed is:

1. A plasma processing apparatus, comprising:
a chamber;
a lower electrode disposed within the chamber and including a lower surface and an opposing upper surface configured to seat a wafer;
an RF rod disposed on the lower surface of the lower electrode and extending in a vertical direction;
an RF plate including a first portion contacting the lower surface of the lower electrode, a second portion protruding from the first portion towards the RF rod, and a third portion extending from the second portion to connect the RF rod; and
a grounding electrode spaced apart from the RF plate and at least partially surrounding a side wall of the RF rod and a side wall of the second portion of the RF plate, wherein the grounding electrode includes a first grounding electrode facing each of the side wall of the RF rod and the second portion of the RF plate, and a second grounding electrode at least partially surrounding the first grounding electrode, and configured to horizontally rotate.

2. The plasma processing apparatus of claim 1, wherein a width of the second portion of the RF plate decreases as the second portion of the RF plate extends towards the RF rod, and
the side wall of the second portion of the RF plate has a curved shape.

3. The plasma processing apparatus of claim 1, wherein the first grounding electrode includes a first side wall portion vertically extending along the side wall of the RF rod, and first wing portions spaced apart from one another and extending along the side wall of the second portion of the RF plate.

4. The plasma processing apparatus of claim 3, wherein the second grounding electrode includes a second side wall portion vertically extending along the first side wall portion, and second wing portions spaced apart from one another and extending along the side wall of the second portion of the RF plate, wherein horizontal rotation of the second wing portions positions each one of the second wing portions between adjacent ones of the first wing portions.

5. The plasma processing apparatus of claim 1, further comprising:

a guide portion connected to the second grounding electrode and configured to guide vertical movement of the second grounding electrode during horizontal rotation of the second grounding electrode.

6. The plasma processing apparatus of claim 5, wherein the guide portion includes a guide ring at least partially surrounding a side wall of the second grounding electrode, and a guide pin extending from the guide ring towards the side wall of the second grounding electrode and configured to insert into a guide groove formed in the side wall of the second grounding electrode.

7. The plasma processing apparatus of claim 1, further comprising:

an insulating plate at least partially surrounding a side wall of the lower electrode and a side wall of the first portion of the RF plate;

an insulator ring at least partially surrounding a side wall of the insulating plate; and a focus ring spaced apart from the insulator ring and disposed on upper surfaces of the lower electrode and the insulating plate.

8. The plasma processing apparatus of claim 7, further comprising:

a baffle unit spaced apart from the insulator ring and disposed between the insulator ring and a side wall of the chamber.

9. The plasma processing apparatus of claim 7, further comprising:

a baffle unit contacting the insulator ring and disposed between the insulator ring and a side wall of the chamber.

10. The plasma processing apparatus of claim 7, further comprising:

a conductor ring spaced apart from the focus ring and at least partially surrounding a side wall of the insulator ring.

11. The plasma processing apparatus of claim 10, further comprising:

a baffle unit spaced apart from the conductor ring and disposed between the conductor ring and a side wall of the chamber.

12. A plasma processing apparatus comprising:
a chamber;

a lower electrode disposed within the chamber and including a lower surface and an opposing upper surface configured to seat a wafer;

an RF rod disposed on the lower surface of the lower electrode and downwardly extending;

an RF plate including a first portion contacting with the lower surface of the lower electrode, a second portion extending downward from the first portion towards the RF rod, and a third portion extending downward from the second portion to connect the RF rod;

a first grounding electrode spaced apart from the RF plate and at least partially surrounding a side wall of the RF rod and a side wall of the second portion of the RF plate;

an insulator ring at least partially surrounding a side wall of the lower electrode and a side wall of the first portion of the RF plate; and a conductor ring at least partially surrounding a side wall of the insulator ring, wherein the first grounding electrode includes a first side wall portion vertically extending along the side wall of the RF rod, and first wing portions spaced apart from one another, respectively having a curved shape and extending along the side wall of the second portion of the RF plate and towards an edge of the first portion of the RF plate.

13. The plasma processing apparatus of claim 12, further comprising:

a grounding plate disposed below the RF plate and contacting the conductor ring.

14. The plasma processing apparatus of claim 12, further comprising:

a baffle unit spaced apart from the conductor ring and disposed between the conductor ring and a side wall of the chamber.

15. The plasma processing apparatus of claim 12, further comprising:

a second grounding electrode at least partially surrounding the first grounding electrode, and configured to horizontally rotate, wherein the second grounding electrode includes a second side wall portion vertically extending along the first side wall portion, and second wing portions spaced apart one from another and respectively extending along the side wall of the second portion of the RF plate.

16. The plasma processing apparatus of claim 15, wherein each of the second wing portions has a curved shape and further extends towards the edge of the first portion of the RF plate, and horizontal rotation of the second grounding electrode positions each of the second wing portions between adjacent ones of the first wing portions.

* * * * *